United States Patent
Dickson et al.

(10) Patent No.: US 7,872,489 B2
(45) Date of Patent: Jan. 18, 2011

(54) RADIATION INDUCED FAULT ANALYSIS

(75) Inventors: Kristofor J. Dickson, Austin, TX (US);
Kent B. Erington, Austin, TX (US);
John E. Asquith, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 439 days.

(21) Appl. No.: 12/110,824

(22) Filed: Apr. 28, 2008

(65) Prior Publication Data
US 2009/0271675 A1  Oct. 29, 2009

(51) Int. Cl.
*G01R 31/26* (2006.01)
(52) U.S. Cl. .................. 324/765; 324/751; 324/752
(58) Field of Classification Search ............... None
See application file for complete search history.

(56) References Cited

U.S. PATENT DOCUMENTS

| | | | |
|---|---|---|---|
| 4,786,865 A | | 11/1988 | Arimura et al. |
| 6,078,183 A | * | 6/2000 | Cole, Jr. ............. 324/752 |
| 6,549,022 B1 | | 4/2003 | Cole, Jr. et al. |
| 6,967,491 B2 | | 11/2005 | Perdu et al. |
| 7,038,474 B2 | | 5/2006 | McGinnis et al. |
| 2005/0006602 A1 | | 1/2005 | Perdu et al. |

OTHER PUBLICATIONS

Rowlette, Jeremy et al. "Critical Timing Analysis in Microprocessors Using Near-IR Laser Assisted Device Alteration (LADA)." ITS International Test Conference. Paper 10.4. pp. 264-273. Copyright 2003 IEEE.
Bodoh, Dan et al. "Diagnostic Fault Simulation for the Failure Analyst." Freescale Semiconductor, Austin, TX. pp. 1-10. 2004.

* cited by examiner

*Primary Examiner*—Minh N Tang
(74) *Attorney, Agent, or Firm*—Gary R. Stanford (57) ABSTRACT

A method of locating a defect of a failed semiconductor device which includes applying a test pattern to the failed semiconductor device and providing failed semiconductor device test responses as a pass signature, applying radiation to each of multiple locations of circuitry of a correlation semiconductor device with sufficient energy to induce a fault in the circuitry, applying the test pattern to the correlation semiconductor device while the radiation is applied to the location and comparing correlation semiconductor device test responses with the pass signature for each location, and determining a defect location of the failed semiconductor device in which correlation semiconductor device test responses at least nearly match the pass signature. The radiation may be a laser beam. The method may include determining an exact match or a near match based on a high correlation result. Asynchronous scanning may be used to provide timing information.

20 Claims, 3 Drawing Sheets

RADIATION INDUCED FAULT ANALYSIS

BACKGROUND OF THE INVENTION

1. Field of the Invention

The present invention relates in general to diagnosis of failing integrated circuits, and more specifically to a radiation induced fault analysis system and method for determining location of defects on failed integrated circuits.

2. Description of the Related Art

A variety of radiation-based stimulation circuit testing techniques are known for failure or performance analysis of semiconductor devices. Radiation stimulation involves the use of various forms of radiation or emissions or the like with sufficient energy to modify operating behavior of semiconductor circuitry for the purpose of identifying potential problem areas of the semiconductor device. Although many types of radiation may be used, it is desired that the radiation convey sufficient energy to modify circuit operation for purposes of testing the limits of circuit operation. A laser beam, for example, is capable of conveying a significant level of power without damaging semiconductor circuitry and thus is often the radiation of choice for testing. The circuit modification may be any one or more of multiple types, such as modified timing of a device (e.g., transistor, gate, node, etc.), modified voltage level, modified current level, etc. A timing adjustment may reveal, for example, a race condition between two or more circuit paths thereby limiting maximum frequency of operation of the semiconductor device. Similarly, a marginal voltage or current level affecting pass-fail behavior may be revealed using radiation perturbation during testing.

Laser assisted device alteration (LADA) is a known laser scan technique used in the failure analysis of semiconductor devices. A laser generated by a laser scanning microscope (LSM) or the like is used to alter the operating characteristics of transistors, metal interconnects or other components on the semiconductor device under test (DUT) while it is electrically stimulated. Certain operating characteristics of the laser (e.g., wavelength, size, power, etc.) may be selected or otherwise adjusted to modify circuit characteristics, such as circuit timing and/or voltage or current levels. For example, a laser operating at a wavelength of approximately 1,064 nanometers (nm) produces localized photocurrents within active transistor layers in which the photo-generated currents modify circuit timing or voltage levels. Alternatively, a laser operating at a wavelength of approximately 1,340 nm produces localized heating which also alters circuit timing (e.g., slowing down of logic transitions). It has been observed that photocurrent injection enables significantly larger timing shifts as compared to thermally induced alteration, so that photocurrent injection is more commonly used for "standard" LADA testing. Electrical stimulation of the DUT is usually performed by automated test equipment (ATE) which applies an ATE test loop or test pattern to the DUT and monitors the results. The term "ATE" as used herein refers to any test equipment or electronic device or system or the like which provides electrical stimulation to a DUT and which monitors results. The test pattern is designed by test engineers with multiple test vectors applied in sequential order to perform critical timing testing. The test equipment may also adjust one or more test variables, such as laser power, supply voltages, temperature, clock frequency, etc., to adjust operation relative to a pass-fail boundary of the voltage-frequency relationship (which may be plotted on a "shmoo" graph to illustrate the pass-fail boundary as known to those skilled in the art).

Techniques, such as laser assisted device alteration (LADA) or soft defect localization (SDL), use a laser to analyze voltage, frequency and/or temperature sensitive devices to identify internal failing circuit locations caused by soft defects on the device. A "soft" defect is one in which circuit behavior depends upon voltage, frequency and/or temperature variations. Whereas the LADA and SDL techniques, among others, are useful for identifying soft defects, they are not effective for determining "hard" defect locations. A "hard" defect is usually caused by a physical defect or the like during manufacture which modifies circuit behavior. The modified circuit behavior caused by a hard defect is generally independent of voltage, frequency and/or temperature variations. Thus, a device under test with a hard defect usually produces a failed test result regardless of changes to any variable in the test system so that LADA techniques are not feasible. Software defect localization techniques implement design models, fault models, and simulations in an attempt to predict potential defect locations inside failing die based on combinations of failing test results. Software techniques, however, are based on simplified circuit and test models which may or may not accurately duplicate the fault(s). Also, software techniques are typically only effective for scan based test patterns and do not work for functional tests. This is partly due to the added complexity of functional patterns and finite computer computational resources available.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
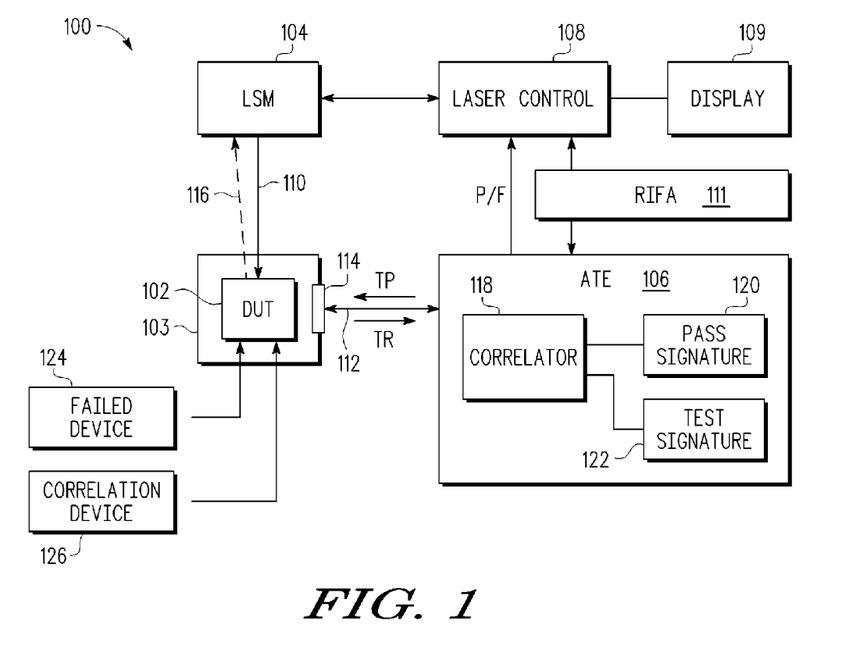
FIG. 1 is a simplified block diagram of a radiation induced fault analysis (RIFA) test system implemented according to an exemplary embodiment.

FIG. 1 is a simplified block diagram of a radiation induced fault analysis (RIFA) test system 100 implemented according to an exemplary embodiment. The illustrated RIFA test system 100 employs a laser beam as the radiation type, and thus may alternatively be referred to as laser induced fault analysis (LIFA) test system. It is understood, however, that radiation methods other than lasers are contemplated. The RIFA test system 100 includes a laser scanning microscope (LSM) 104, automated test equipment (ATE) 106, a laser control system 108, and a RIFA test procedure 111. The laser control system 108 is further shown with a display device 109 for displaying images providing visual test results as further described below. A semiconductor device under test (DUT) 102 is installed or mounted onto a suitable fixture 103 of the LSM 104 for exposure by a laser beam 110 from the LSM 104 for purposes of testing as described herein. The fixture 103 includes an input/output (I/O) interface 114 (e.g., connector) for electrically connecting each pin or node of interest of DUT 102. An I/O cable 112 (or multiple conductors or sensors or the like) is coupled between the ATE 106 and the I/O interface 114 of the fixture 103 to enable access and control by the ATE 106 as understood by those skilled in the art. The laser control system 108 is coupled via the appropriate interfaces to control the LSM 104 for controlling testing and for receiving test responses. In one embodiment the LSM 104 is a non-pulsed continuous wave (CW) laser system, such as, for example, the Zeiss LSM 310 manufactured by Carl Zeiss, Inc. The ATE 106 is configured to program any initial conditions or states of the DUT 102 and to provide one or more selected test programs appropriate for the DUT 102 and to monitor and store test responses. The ATE 106 may further be configured to adjust any one or more of selected operating conditions or parameters, such as voltage supply levels, clock frequency, temperature, etc. The laser control system 108 controls the LSM 104 and receives a pass-fail (P/F) signal from the ATE 106 indicating test results while testing the DUT 102.

The laser control system 108 is implemented in any suitable fashion, such as any combination of software, firmware or hardware. In one embodiment, the laser control system 108 is configured as a personal computer (PC) or the like having a video monitor implementing the display device 109. The computer system may include an interface card or the like for interfacing the LSM 104 and ATE 106 as understood by those skilled in the art. The ATE 106 performs test operations as described herein and provides the P/F signal to the laser control system 108 indicating pass or fail test results. In one embodiment, the laser control system 108 is configured to overlay or inject graphic representations of the test results (e.g., pass-fail indications) onto an image displayed on the display device 109 to provide a visual representation of the test results. For example, an initial image may be a grayscale image of the circuitry of the DUT 102, and the test results may be indicated as "bright" pixels (or spots) or "dark" pixels or "colored" pixels to provided desired contrast with the background circuit image. In one embodiment, for example, a pass indication is marked by a bright pixel and a fail indication is marked by a dark pixel. Alternatively, pass indications are one color (e.g., green) and fail indications are another color (e.g., red).

In the illustrated embodiment, the ATE 106 includes a correlator 118 and memory for storing test responses referred to as "signatures". A signature is a database of test information or data (in the form of bits, bytes, vectors, etc.) used for purposes of determining the results of testing. As shown, the correlator 118 compares a pass signature 120 with a test signature 122 that are each collected while testing the DUT 102. In operation, the ATE 106 provides a test pattern (TP) to the DUT 102 and receives corresponding test responses (TR). The test pattern TP is designed by test engineers with multiple test vectors applied to the DUT 102 in sequential order to perform critical timing, logic function testing, and other types of circuit behavior testing as understood by those skilled in the art. Each test vector represents a specific set of logic conditions which are applied to and received from the DUT 102 during each test vector cycle. The test responses TR in response to a given test pattern TP are stored as a test signature 122 which is compared or otherwise correlated by the correlator 118 with the pass signature 120 for determining "pass" or "fail". As an example, if the test signature 122 matches the pass signature 120, then the DUT 102 passes the test, and if the signatures do not match the DUT 102 fails the test. The test result is indicated to the laser control system 108 via the P/F signal. In one embodiment, the collective test responses TR during testing of a correlation device 126 are stored as the test signature 122, and the newly stored test signature 122 is compared with the previously stored pass signature 120 by the correlator 118 to determine whether the signatures match. Alternatively, the test responses TR received during testing of the correlation device 126 are compared with the pass signature 120 as they are received.

The RIFA test procedure 111 is shown interfaced with the laser control system 108 and the ATE 106. In one embodiment, the RIFA test procedure 111 is implemented as a separate controller for controlling the RIFA test system 100 according to RIFA test procedures as described herein. Alternatively, the RIFA test procedure 111 may be a control function which is distributed between the laser control system 108 and the ATE 106. In yet another embodiment, the RIFA test procedure 111 may simply represent RIFA operating procedures performed by test personnel while controlling the RIFA test system 100 according to RIFA test procedures as described herein. The RIFA test system 100 is configured to identify the possible circuit location(s) of a hard or soft defect in failed device 124. Thus, the RIFA test system 100 is applicable for both hard and soft defect localization. The failed device 124 is one which has failed functional testing or the like during or at the end of the manufacturing process or which has failed subsequent testing (such as by the manufacturer or its customers). As described below, further investigation of the failed device fail signature using the RIFA procedure on a correlation device 126 reveals a probable schematic and/or physical location of a defect. The failed device 124 and the correlation device 126 are intended to have substantially the same circuitry other than any unintended defects or faults in the failed device 124.

Figure 2:
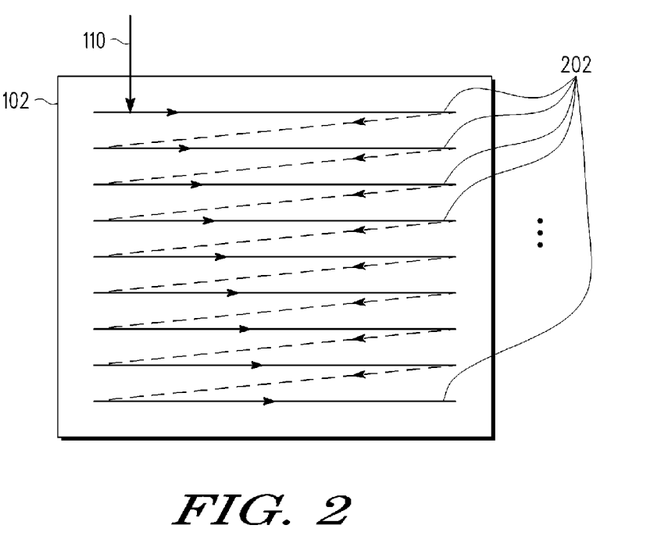
FIG. 2 is a simplified diagram of a selected circuit area of interest of the DUT of FIG. 1 illustrating laser scanning operation according to one embodiment.

FIG. 2 is a simplified diagram of a selected circuit area of interest of the DUT 102 illustrating laser scanning operation according to one embodiment. Horizontal scan lines 202 are shown across the area of the DUT 102 depicting scan lines of the laser beam 110. Dotted diagonal lines shown between the horizontal lines depict the return of the laser beam 110 from one horizontal scan line 202 to the next. In one embodiment, the laser beam 110 scans the DUT 102 from top to bottom following each horizontal scan line 202 from left to right. After following each horizontal scan line 202 from left to right, the laser beam 110 returns to the next lower horizontal scan line 202 and repeats from top to bottom of the DUT 102 until the area of interest is scanned, and then returns back to the top horizontal scan line 202 similar to the sequential scanning technique of a video monitor or television. Although not explicitly shown, each horizontal scan line 202 is subdivided as a row of picture element (pixel) locations in which the number of pixel locations defines the horizontal scan resolution. In one embodiment, 512 horizontal scan lines 202 are included in which each horizontal scan line 202 includes 512 pixels, although other resolutions are contemplated. As described further below, the DUT 102 may be scanned using an imaging power level laser beam and a laser reflection 116 is captured by the LSM 104 and mapped to provide a scanned image of the DUT 102 for navigation purposes.

Figure 3:
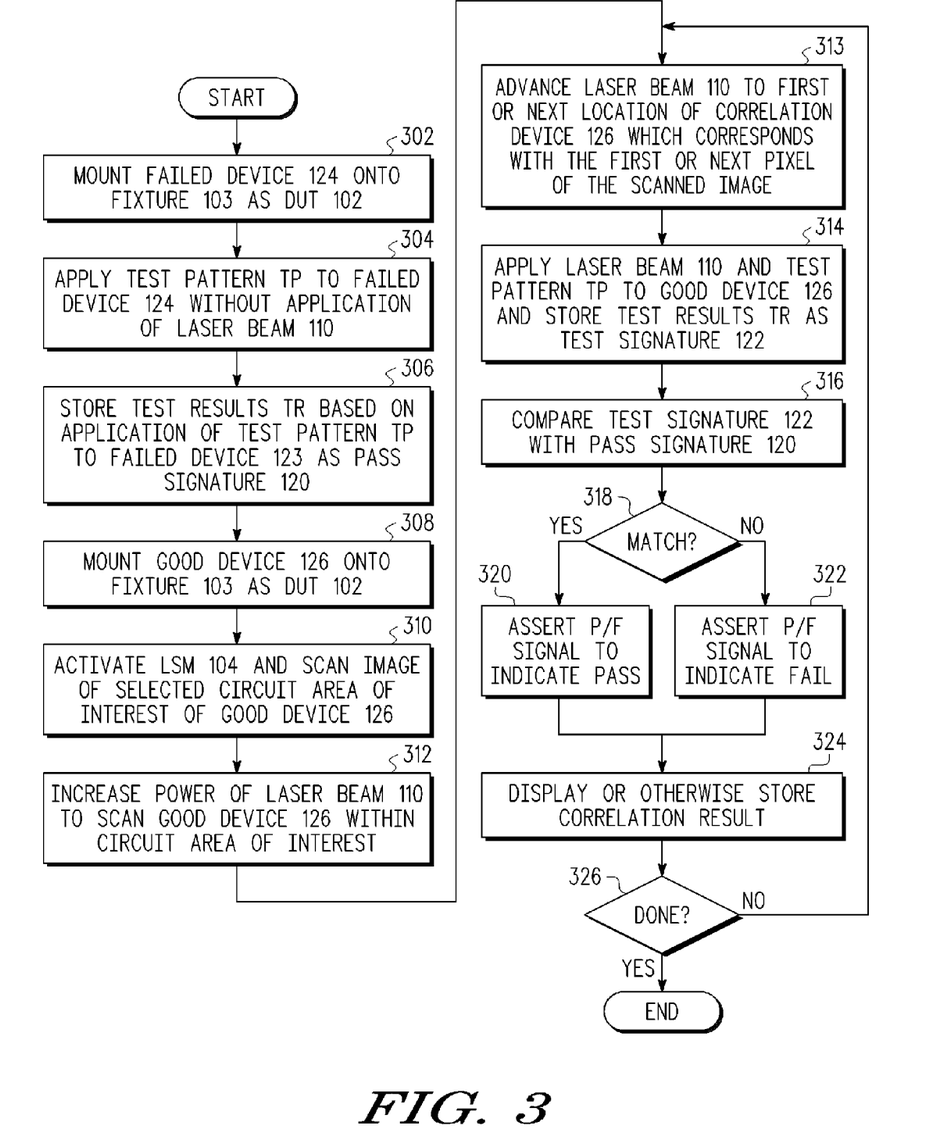
FIG. 3 is a flowchart diagram illustrating operation of the RIFA test procedure of FIG. 1 according to one embodiment.

FIG. 3 is a flowchart diagram illustrating operation of the RIFA test procedure 111 according to one embodiment. At a first block 302, the failed device 124 is mounted onto the fixture 103 as the DUT 102. At next block 304, the ATE 106 executes a test program by applying the test pattern TP to the failed device 124 as DUT 102 and receives the test responses TR while the LSM 104 is temporarily suspended or turned off. Thus, the laser beam 110 does not modify circuit operation of the failed device 124 while the test pattern TP is applied. Assuming the failed device 124 includes a defect, the test responses TR would otherwise fail since the test responses TR of the failed device 124 would not match corresponding test responses of a "good" device. A "good" device refers to a non-defective device that behaves in the as-designed way, so that test responses received while testing a good device exactly match expected test responses. A normal or conventional test procedure would include storing the test responses of a known good device as the pass signature 120 and comparing test responses of an unknown device with the pass signature 120 to determine whether an exact match occurred. A match would identify a passing device and thus a good device, whereas a mismatch would identify a failure of the unknown device. The correlation device 126 is a good device which otherwise produces expected test responses. In this manner, the test signature generated in response to the test pattern TP applied to the correlation device 126 (mounted as the DUT 102) would not match the test signature generated in response to the same test pattern TP applied to the failed device 124. Thus, if the signature associated with the correlation device 126 was stored as the pass signature 120 and the signature associated with the failed device 124 was compared by the correlator 118, the ATE 106 would indicate failure of the test program via the P/F signal. Contrary to that of a conventional test procedure, at next block 306 the test responses TR of the failed device 124 are stored as the pass signature 120 in response to the test pattern TP.

Subsequently, according to the RIFA test procedure 111, at next block 308 the correlation device 126 (a known good device) is mounted onto the fixture 103 as the DUT 102. At next block 310, the laser control system 108 activates the LSM 104 and scans a selected circuit area of interest of the correlation device 126 as the DUT 102 (entire circuit area or a selected portion thereof) at an imaging power level in which the laser reflection 116 is captured by the LSM 104 as a reflected image of the circuitry of the area of interest. The reflected image is provided to the laser control system 108 for storage and/or display on the display device 109. The scanned image of the correlation device 126 is a visual image for purposes of navigation of the area of interest of the circuitry for purposes of analysis. At next block 312, the laser beam 110 is set to a relatively high power level for scanning of the correlation device 126 within the same circuit area of interest of the image scan. In one embodiment, the scanning is similar to that described for image scanning except at a significantly slower scan rate or otherwise a discrete scan to enable testing on a "location-by-location" basis. The scan is performed slowly or otherwise in a discrete manner in which the laser beam 110 is positioned at a selected one of multiple locations while applying the entire test pattern TP. In one embodiment, the scanned image of the failed device 124 is performed on a pixel-by-pixel basis, and the scanned image is then used for navigation purposes while applying the laser to the correlation device 126. For example, the laser beam 110 is parked at each pixel location for the duration of each test pattern TP, and the process is repeated on a pixel-by-pixel basis. The power of the laser beam 110 is selected to deliver sufficient energy to inject a temporary fault within the circuitry of the semiconductor die of the correlation device 126. For example, the laser beam 110 has sufficient energy to mimic a defect (e.g., stuck at "0" fault or stuck at "1" fault) of a logic gate or transistor being exposed to the laser beam 110. The power of the laser beam 110, however, is not sufficiently high to harm, destroy or otherwise permanently modify the physical structure of the semiconductor die of the correlation device 126.

At next block 313 the laser beam is advanced to a first or next location on the correlation device 126 which corresponds with the first or next pixel, respectively, of the scanned image (used for navigation purposes) in order to perturb the circuitry of the correlation device 126 at that location. At next block 314, the ATE 106 applies the test pattern TP to the correlation device 126 as DUT 102 while the laser beam 110 perturbs the circuitry of the DUT 102 at the corresponding location and the collective test responses TR of the test pattern TP is stored as the test signature 122. At next block 316 the test signature 122 is compared with the pass signature 120 by the correlator 118. In an alternative embodiment, the test responses TR while testing the correlation device 126 are compared and mismatches are logged or counted "on-the-fly" to avoid storage of the entire test signature 122. At next block 318 it is queried whether the test signature 122 matches the pass signature 120. If the signatures match as determined at block 318, then operation proceeds to block 320 in which the ATE 106 asserts the P/F signal to indicate that the test "passed" since the signatures matched each other. Otherwise, if the signatures do not match, then operation proceeds instead to block 322 in which the ATE 106 asserts the P/F signal to indicate that the test failed. After either block 320 or 322, operation proceeds to block 324 in which the laser control system 108 stores or otherwise displays the results on the display device 109. In one embodiment, the P/F test results are used to update the original scanned image (block 304) to generate a RIFA image. In one embodiment graphic information is used to update the image, such as using selected pixel illuminations (e.g., bright for passing, dark for failing) or selected colors (e.g., green for passing, red for failing) or the like. At next block 326, it is queried whether the test procedure is completed. If the test pattern TP and the laser beam 110 have been applied to each pixel location of the entire selected circuit area of interest of the correlation device 126, then operation is completed. Otherwise, operation proceeds back to block 313 in which operation is advanced to the next pixel location of the selected circuit area of interest. Operation is repeated in this manner for the entire circuit area of interest of the correlation device 126.

The RIFA test procedure 111 illustrated by the flowchart diagram of FIG. 3 may be automated so that many test signatures are saved and logged during wafer probe testing in order to generate the fail signature for RIFA testing with a passing unit. Note that this would enable the failing units to be analyzed without being packaged or prepared for failure analysis. An automated flow enables the analyst to determine the best candidates for further analysis by selecting those units that have the best fitting fail signature matching.

In summary, the laser beam 110 set to high power to deliver sufficient energy to perturb the circuitry of the correlation device 126 corresponding to each pixel location to induce a temporary fault while the entire test pattern TP is provided and corresponding test responses TR received. The laser beam 110 is advanced on a pixel-by-pixel basis in a similar as a raster scan of a video monitor (e.g., matrix of pixels in horizontal and vertical area of area of interest), and this process is repeated for the entire area of interest of the correlation device 126 as the DUT 102. Each collective set of test responses TR for the correlation device 126 for each pixel is stored as the test signature 122 and compared with the pass signature 120 by the correlator 118 (or otherwise compared on-the-fly), and the result of the comparison is indicated by the P/F signal. It is appreciated that the laser beam 110 induces a fault in the circuitry of the correlation device 126 at the illuminated location, which would normally result in a failure during a conventional test procedure. While the laser beam 110 perturbs a location other than the actual fault location of the failed device 124, the test signature 122 of the correlation device 126 does not match the pass signature 120 of the failed device 124 so that a "failure" is indicated. When a test signature 122 received during laser perturbed testing of the correlation device 126 matches or otherwise correlates to a relatively high degree with the signature 120 of the failed device 124, however, then the circuit location of the correlation device 126 which corresponds with the pixel location of the laser beam 110 is determined to correspond with the fault location causing failure of the failed device 124. This is because the laser beam 110 induces or otherwise generates a temporary fault on the correlation device 126 which mimics the same fault or defect which exists on the failed device 124 resulting in the same, or substantially similar, signature during testing. In this manner, the RIFA test procedure 111 identifies the location of a defect causing the failure of the failed device 124.

It is appreciated that a software-driven fault simulator may replicate many different types of faults any number of times or locations within the circuitry whereas radiation, such as the laser beam 110, according to the RIFA test procedure inserts a limited set of fault-types (limited to primarily stuck at "1" or stuck at "0" types) at one location at a time. Software techniques use design models, fault models, and simulations in an attempt to predict potential defect locations. Software techniques, however, are based on simplified circuit and test models which may or may not accurately duplicate the fault(s). Also, software techniques are effective for scan tests but do not work on functional tests. The RIFA test procedure induces the fault on the actual circuitry of the correlation (passing) unit and measures actual results increasing the likelihood of detecting any fault or defect which appears as a stuck at 1 or 0 fault. The simplicity of the RIFA technique allows for fast and accurate fault analysis results without the need for any schematic, device layout navigation or other expensive computer based tool sets.

The laser 110 inserts one fault at a time so that if the failed device has two or more defects or faults, then the likelihood of isolating and identifying either fault or defect is reduced. Empirical results have shown, however, that the vast majority of failed parts (e.g., 99%) have only one fault or defect at a time so that the RIFA test procedure is an effective method for identifying the cause of failure of a significant number of semiconductor devices. It is further appreciated that the test program may be adjusted or modified to increase the chances of isolating a single defect of the failed device 126. For example, although general test patterns are typically written to toggle or test each node of a semiconductor device, the test pattern may be modified or designed to isolate and test particular suspect nodes or devices on the semiconductor die. Although the RIFA method as described herein is particularly advantageous for isolating and detecting a single defect, it may be used in a similar manner to detect multiple defects on the failed device 126, such as by suitable design or modification of the test program TP.

The RIFA method may be specifically configured to examine close matches or near matches between the test responses or signatures rather than exact matches. In many cases an exact match may not be produced when the injected fault does not behave in the exact same manner as the actual defect or fault. For example, a broken wire that creates an electrical open can float to any voltage level and can vary during testing such that it does not behave as a "stuck at" fault in which voltage is specifically pulled to one voltage or another (e.g., pulled to VDD or VSS). Thus, the injected fault produces a failing signature that is close to the defective but does not produce an exact match. A near match, however, may provide sufficient valuable information to isolate the fault. A near match may be identified when the signatures "correlate" to a relatively high degree. In one embodiment, one or more "don't cares" are inserted into the test pattern TP and/or the signatures so that certain pins, vector cycles or combinations thereof are ignored for purposes of signature comparisons. In this manner, a close match that varies only by "don't care" conditions otherwise appears as an exact match thereby isolating a potential defect for fault. In another embodiment, the number of non-matching test cycles are counted for each test pattern. For example, a global P/F signal from the ATE 106 that indicates failing or mismatched cycles versus time may be provided. Different graphics or display variables may be employed to illustrate or display test responses. For example, a full bright pixel or spot identifies an exact match, in which the brightness or intensity is decreased towards the black level as the number of mismatched cycles occur during each test pattern. In one embodiment even a single test cycle mismatch is displayed in a noticeable manner to quickly distinguish exact versus close matches.

Experimental results have revealed that faults are not induced at certain circuit portions of certain semiconductor devices using a continuous wave (CW) laser at a single wavelength (e.g., CW laser at 1,064 nm). The laser power level might be increased somewhat for some nodes, yet the power is limited to a value below a permanent damage threshold level. Persons skilled in the art readily appreciate that certain other radiation variables may be employed to improve modulation effectiveness and increase the percentage of fault inducible nodes while preventing damage to the semiconductor die. For example, improving perturbation while minimizing damaging power level to improve RIFA test effectiveness may be achieved by changing or adjusting any one or more radiation variables, such as radiation type, wavelength, pulse width (using pulsed laser equipment), synchronized pulsing of pulsed laser, radiation on-time duration, optical techniques, defocusing techniques, light beam intensity, etc. For example, in the case of thinned flip chip devices a laser wavelength in the range of 750 to 900 nm can provide a greater circuit perturbation effect that results in more effective test modulation results than a laser at a higher wavelength such as 1,064 nm. In other circuit cases any visible or ultraviolet (UV) wavelength may be used for an even greater perturbation effect when the silicon (Si) bulk is removed. This latter technique applies to devices manufactured using silicon on insulator technology.

The isolation and determination of a defect or fault may lead to determination of a cause of the fault in the semiconductor manufacturing process. As an example, a metal process step may lead to a defect on the semiconductor die. It is appreciated that many systemic problems may not be reflected in the same manner from one semiconductor die to another of a given part type. A systemic defect, for example, may cause defects or hard faults that otherwise appear random or which cause randomly distributed hard faults. Identification and examination of these defects in the semiconductor die, however, provides a powerful tool for manufacturing and test personnel for isolating and correcting such systemic problems to improve process yield. The RIFA test procedure 111 allows for the timely identification of defect locations present inside mass-produced large scale integrated (LSI) devices, such as microprocessors and the like, which provides a significant financial impact. For example, when defects are readily identified and understood, changes to the manufacturing process can be implemented to improve yield.

Figure 4:
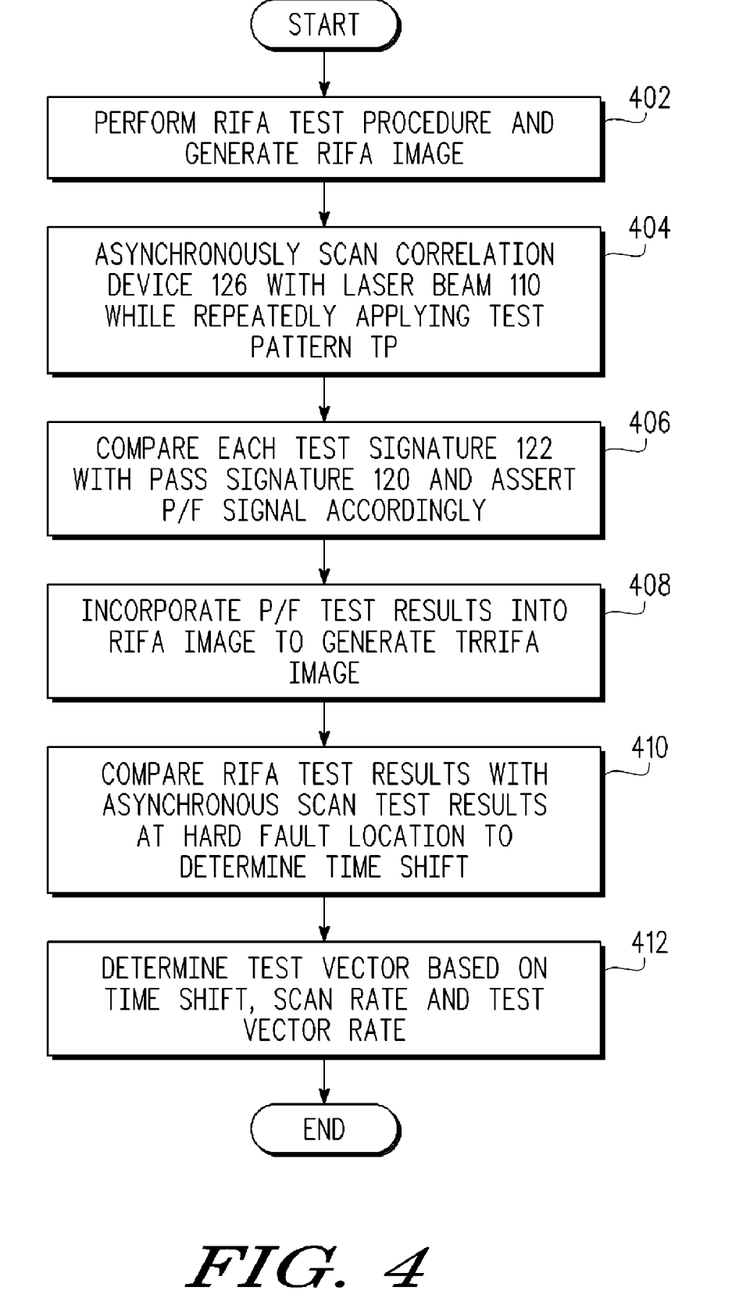
FIG. 4 is a flowchart diagram illustrating a time resolved RIFA (TRRIFA) test procedure according to one embodiment.

FIG. 4 is a flowchart diagram illustrating a time resolved RIFA (TRRIFA) test procedure according to one embodiment. At first block 402, the RIFA test procedure 111 is performed, such as according to that shown in FIG. 3, and a corresponding RIFA image is generated. At next block 404, the selected circuit area of interest of the correlation device 126 is asynchronously scanned with the laser beam 110 while the ATE 106 repeatedly applies the test pattern TP. The power and other parameters of the laser beam 110 are the same as that used for the RIFA test procedure 111, except that the laser beam 110 is asynchronously scanned across multiple pixel locations of the correlation device 126 for each application of the test pattern TP rather than on a pixel-by-pixel basis. The scan rate of the laser beam 110 may be selected based on the test vector rate and number of test vectors of the test pattern TP and then adjusted as desired to provide suitable TRRIFA test results. The laser beam 110 repeatedly scans the selected circuit area of the correlation device 126 similar to a video raster scan to capture a sufficient amount of timing information. At next block 406, each test signature 122 received for each test pattern TP is compared with the pass signature 120 and the P/F signal is asserted accordingly. Block 406 incorporates substantially the same procedure described in blocks 318, 320 and 322 of FIG. 3 except that block 406 performed on a continuous basis during laser scanning rather than on a pixel-by-pixel basis as described for the RIFA procedure. At next block 408, the P/F test results are incorporated into the RIFA image to generate a TRRIFA image. The information may be stored for subsequent display or displayed in real-time. The RIFA image may be modified in a similar manner previously described, such as using graphic information or the like, to provide the TRRIFA image.

At next block 410, the RIFA test results are compared with the asynchronous scan test results at the hard fault location to determine the time shift. In one embodiment, the time shift is measured based on a pixel shift between the hard fault location indicated in the RIFA and TRRIFA images and the shifted fault indication in the TRRIFA image. For example, the TRRIFA image is examined and the number of pixels between the hard fault location and the shifted fault indication is counted. The shifted fault indication is generated in substantially the same manner during the TRRIFA test as for the RIFA test except that the results are shifted in time because the laser beam 110 is moving rather than being substantially stationary during each application of the test pattern TP. In an alternative embodiment, the time shift may be directly monitored, such as by an oscilloscope or the like. At next block 412, a test vector is determined based on the determined time shift, the scan rate of the laser and the test vector rate, and operation is completed. In this manner, the time shift information is used to identify at least one test vector within the test pattern. The test vector information may then be used to set a micro-probing window for subsequent testing to more clearly identify and define the specific hard fault on the failed device 124.

A method of locating a defect of a failed semiconductor device according to one embodiment includes applying a test pattern to the failed semiconductor device and providing failed semiconductor device test responses as a pass signature, applying radiation to each of multiple locations of circuitry of a correlation semiconductor device with sufficient energy to induce a fault in the circuitry, where the correlation semiconductor device has substantially the same circuitry as the failed semiconductor device, applying the test pattern to the correlation semiconductor device while the radiation is applied to the location and comparing correlation semiconductor device test responses with the pass signature for each location, and determining a defect location of the failed semiconductor device in which correlation semiconductor device test responses at least nearly match the pass signature.

The radiation may be a laser beam or the like. The method may include dividing the circuitry into a matrix of pixels corresponding to a scan image. The method may include scanning an image of the circuitry of the failed semiconductor device to provide the scan image, converting comparison results into graphic information, and incorporating the graphic information into the scan image.

The method may include determining whether the correlation semiconductor device test responses exactly match the pass signature. Alternatively, the method may include determining whether the correlation semiconductor device test responses correlate with the pass signature to a high degree. In this latter case, the method may further include comparing a portion of the correlation semiconductor device test responses with a corresponding portion of the pass signature.

After determining a defect location, the method may further include asynchronously scanning the circuitry of the correlation semiconductor device with the radiation with sufficient energy to induce a fault in the circuitry while repeatedly applying the test pattern to the correlation semiconductor device, comparing correlation semiconductor device test responses with the pass signature for providing fault timing information for each application of the test pattern, and determining a time shift between the defect location and the fault timing information. In this case the method may further include providing a first indication of the defect location on a scan image, providing a second indication of the fault timing information on the scan image, measuring a pixel shift between the first and second indications, and converting the pixel shift to the time shift based on radiation scan rate. Also, the method may further include determining a test vector of the test pattern based on the time shift information and a test vector rate of the test pattern.

A method of locating a defect of a failed semiconductor device according to another embodiment includes testing the failed semiconductor device using a test pattern to determine a pass signature, perturbing each of multiple locations of circuitry of a correlation semiconductor device with a laser beam which has operating characteristics for inducing a fault in the circuitry, applying the test pattern to the correlation semiconductor device to provide a corresponding one of multiple test signatures for each of the locations, comparing each test signature with the pass signature, and determining a defect location of the failed semiconductor device where one of the test signatures at least nearly matches the pass signature.

The method may include identifying a location which corresponds with a test signature exactly matching the pass signature. After determining a defect location, the method may further include asynchronously scanning the circuitry of the correlation semiconductor device with the laser beam while repeatedly applying the test pattern to the correlation semiconductor device and providing corresponding test signatures, and comparing each test signature with the pass signature for determining fault timing information.

A radiation induced fault analysis test system for locating a defect in a failed semiconductor device according to one embodiment includes a radiation system, a tester, and a correlator. The radiation system applies radiation with sufficient energy to induce a fault in the circuitry of a correlation semiconductor device. The tester applies a test pattern to the failed semiconductor device and receives test responses as a pass signature. The tester further applies the test pattern to the correlation semiconductor device while radiation is applied to each of multiple circuit locations and receives corresponding test signatures for the circuit locations. The correlator compares each test signature with the pass signature for determining a defect location.

The radiation system may be implemented as a laser system which applies a laser beam to the circuitry of the correlation semiconductor device. The correlator may determine the defect location when a test signature exactly matches the pass signature. Alternatively, the correlator may determine the defect location when a test signature correlates with the pass signature to a high degree. In this latter case, the correlator may be configured to compare only a selected portion of the pass signature with a corresponding portion of each test signature.

The radiation system may further asynchronously scan the circuitry of the correlation semiconductor device with radiation while the tester repeatedly applies the test pattern. In this case the correlator compares each additional test signature with the pass signature for providing a shifted fault indication. Furthermore, a control system may be included which incorporates a first graphic representing the defect location into a scan image and which further incorporates a second graphic representing the shifted fault indication into the scan image.

Although the present invention has been described in considerable detail with reference to certain preferred versions thereof, other versions and variations are possible and contemplated. For example, circuits or logic blocks described herein may be implemented as discrete circuitry or integrated circuitry or software or any alternative configurations. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A method of locating a defect of a failed semiconductor device, comprising:
   applying a test pattern to the failed semiconductor device and providing failed semiconductor device test responses as a pass signature;
   applying radiation to each of a plurality of locations of circuitry of a correlation semiconductor device with sufficient energy to induce a fault in the circuitry, wherein the correlation semiconductor device has substantially the same circuitry as the failed semiconductor device;
   for each location, applying the test pattern to the correlation semiconductor device while the radiation is applied to the location and comparing correlation semiconductor device test responses with the pass signature; and
   determining a defect location of the failed semiconductor device in which correlation semiconductor device test responses at least nearly match the pass signature.

2. The method of claim 1, wherein said applying radiation comprises applying a laser beam.

3. The method of claim 1, further comprising dividing the circuitry into a matrix of pixels corresponding to a scan image, wherein each of the plurality of locations corresponds with a pixel of the matrix of pixels.

4. The method of claim 3, further comprising:
   scanning an image of the circuitry of the failed semiconductor device to provide the scan image;
   converting comparison results into graphic information; and
   incorporating the graphic information into the scan image.

5. The method of claim 1, wherein said comparing correlation semiconductor device test responses with the pass signature comprises determining whether the correlation semiconductor device test responses exactly match the pass signature.

6. The method of claim 1, wherein said comparing correlation semiconductor device test responses with the pass signature comprises determining whether the correlation semiconductor device test responses correlate with the pass signature to a high degree.

7. The method of claim 6, further comprising comparing a portion comprising less than all of the correlation semiconductor device test responses with a corresponding portion of the pass signature during said comparing.

8. The method of claim 1, after said determining a defect location, further comprising:
   asynchronously scanning the circuitry of the correlation semiconductor device with the radiation with sufficient energy to induce a fault in the circuitry while repeatedly applying the test pattern to the correlation semiconductor device;
   for each application of the test pattern, comparing correlation semiconductor device test responses with the pass signature for providing fault timing information; and
   determining a time shift between the defect location and the fault timing information.

9. The method of claim 8, further comprising:
   providing a first indication of the defect location on a scan image;
   providing a second indication of the fault timing information on the scan image; and
   wherein said determining a time shift comprises:
      measuring a pixel shift between the first and second indications; and
      converting the pixel shift to the time shift based on radiation scan rate.

10. The method of claim 8, further comprising determining a test vector of the test pattern based on the time shift information and a test vector rate of the test pattern.

11. A method of locating a defect of a failed semiconductor device, comprising:
    testing the failed semiconductor device using a test pattern to determine a pass signature;
    perturbing each of a plurality of locations of circuitry of a correlation semiconductor device with a laser beam which has operating characteristics for inducing a fault in the circuitry;
    for each of the plurality of locations, applying the test pattern to the correlation semiconductor device to provide a corresponding one of a plurality of test signatures;
    comparing each of the plurality of test signatures with the pass signature; and
    determining a defect location of the failed semiconductor device wherein one of the plurality of test signatures at least nearly matches the pass signature.

12. The method of claim 11, wherein said determining a defect location comprises identifying a location which corresponds with a test signature exactly matches the pass signature.

13. The method of claim 11, after said determining a defect location, further comprising:

asynchronously scanning the circuitry of the correlation semiconductor device with the laser beam while repeatedly applying the test pattern to the correlation semiconductor device and providing corresponding test signatures; and comparing each test signature with the pass signature for determining fault timing information.

14. A radiation induced fault analysis test system for locating a defect in a failed semiconductor device, comprising:

a radiation system for applying radiation with sufficient energy to induce a fault in circuitry of a correlation semiconductor device;

a tester for applying a test pattern comprising a plurality of test vectors to the failed semiconductor device and for receiving test responses as a pass signature, and for applying said test pattern to said correlation semiconductor device while radiation is applied to each of a plurality of circuit locations and for receiving a corresponding one of a plurality of test signatures for each of said plurality of circuit locations; and a correlator which compares each of said plurality of test signatures with said pass signature for determining a defect location.

15. The radiation induced fault analysis test system of claim 14, wherein said radiation system comprises a laser system which applies a laser beam to said circuitry of said correlation semiconductor device.

16. The radiation induced fault analysis test system of claim 14, wherein said correlator determines said defect location based on one of said plurality of test signatures exactly matching said pass signature.

17. The radiation induced fault analysis test system of claim 14, wherein said correlator determines said defect location based on at least one of said plurality of test signatures correlating with said pass signature to a high degree.

18. The radiation induced fault analysis test system of claim 17, wherein said correlator compares only a selected portion of said pass signature with a corresponding portion of each of said plurality of test signatures.

19. The radiation induced fault analysis test system of claim 14, wherein said radiation system asynchronously scans said circuitry of said correlation semiconductor device with radiation while said tester repeatedly applies said test pattern, and wherein said correlator compares each of a second plurality of test signatures with said pass signature for providing a shifted fault indication.

20. The radiation induced fault analysis test system of claim 19, further comprising a control system which incorporates a first graphic representing said defect location into a scan image and further incorporates a second graphic representing said shifted fault indication into said scan image.

* * * * *